United States Patent
Srikanth et al.

(10) Patent No.: US 6,617,891 B2
(45) Date of Patent: Sep. 9, 2003

(54) SLEW RATE AT BUFFERS BY ISOLATING PREDRIVER FROM DRIVER

(75) Inventors: Adhiveeraraghavan Srikanth, Folsom, CA (US); Navneet Dour, Fair Oaks, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/965,110

(22) Filed: Sep. 26, 2001

(65) Prior Publication Data

US 2003/0058006 A1 Mar. 27, 2003

(51) Int. Cl.[7] .............................. H03B 1/00
(52) U.S. Cl. ...................... 327/108; 327/112
(58) Field of Search .................... 327/108, 109, 327/112, 564, 565, 566; 326/82, 83, 87, 91, 101, 102, 23, 24, 26, 27

(56) References Cited

U.S. PATENT DOCUMENTS

| | | | |
|---|---|---|---|
| 4,559,507 A | * 12/1985 | Ramsdale et al. | 327/332 |
| 4,972,436 A | * 11/1990 | Halim et al. | 341/143 |
| 5,734,285 A | * 3/1998 | Harvey | 327/291 |
| 5,959,492 A | * 9/1999 | Khoury et al. | 326/68 |
| 5,963,057 A | * 10/1999 | Schmitt et al. | 326/103 |
| 6,285,214 B1 | * 9/2001 | Zipper | 326/83 |

* cited by examiner

*Primary Examiner*—Timothy P. Callahan
*Assistant Examiner*—Linh Nguyen
(74) *Attorney, Agent, or Firm*—Blakely, Sokoloff, Taylor & Zafman LLP

(57) ABSTRACT

In one embodiment, a pre-driver generates pre-driving signals based on control signals provided by a control circuit. The pre-driver has pre-driver power and ground connections. The pre-driving signals operate at a frequency band. A driver generates an output signal based on the pre-driving signals at an output pad. The output signal has a slew rate. The driver has driver power and ground connections. A low pass filter is coupled between the pre-driver and the driver power and ground connections to reduce the effect of noise at the pre-driving signals. The low pass filter has a cut-off frequency corresponding to the frequency of noise. In another embodiment, a plurality of pre-drivers generates pre-driving signals based on control signals provided by a control circuit. The pre-drivers have pre-driver power and ground connections. A plurality of drivers generates a plurality of output signals based on the pre-driving signals at output pads of an integrated circuit. Each of the output signals has a slew rate. The drivers have driver power and ground connections. On-die pre-driver power and ground planes are coupled to the pre-driver power and ground connections on die of the integrated circuit, respectively. On-die driver power and ground planes are coupled to the driver power and ground connections on-die of the integrated circuit, respectively. The driver power and ground planes are separated from the pre-driver power and ground planes on the die, and/or on the package to maintain the desired slew rate.

15 Claims, 4 Drawing Sheets

SLEW RATE AT BUFFERS BY ISOLATING PREDRIVER FROM DRIVER

BACKGROUND

1. Field of the Invention

This invention relates to buffers. In particular, the invention relates to slew rate control.

2. Description of Related Art

Output buffers in high-speed circuits such as double data rate (DDR) memory and front side bus (FSB) interfaces are important in maintaining data integrity. The signals that are transmitted from the buffer to the external devices outside the device package should have sufficient drive strength and satisfactory slew rate. Slew rate is the rate of change of the signal amplitude. It is typically expressed as the change in voltage with respect to time.

Output pads for a device are subject to ground bounce noise phenomenon. This phenomenon is typically caused by the switching of voltage from one logic level to another. When several outputs change state simultaneously, the combined current variations at these outputs generate noise on power rails which has a significant affect on the rate of change of the signal amplitude. Slew rate control becomes important when there are many outputs switching at the same time, or when the data rate is high.

Therefore, there is a need to have an efficient technique to improve slew rate performance.

BRIEF DESCRIPTION OF THE DRAWINGS

The features and advantages of the present invention will become apparent from the following detailed description of the present invention in which.

DESCRIPTION

The present invention is a technique to improve slew rate performance of a buffer output circuit at an output pad. One embodiment of the invention includes use of a low pass filter to isolate effect of the switching noise on the pre-driver from the driver. Another embodiment is to isolate the power supplies for the pre-drivers from the drivers and use dedicated power and ground planes for the pre-drivers in the device package.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
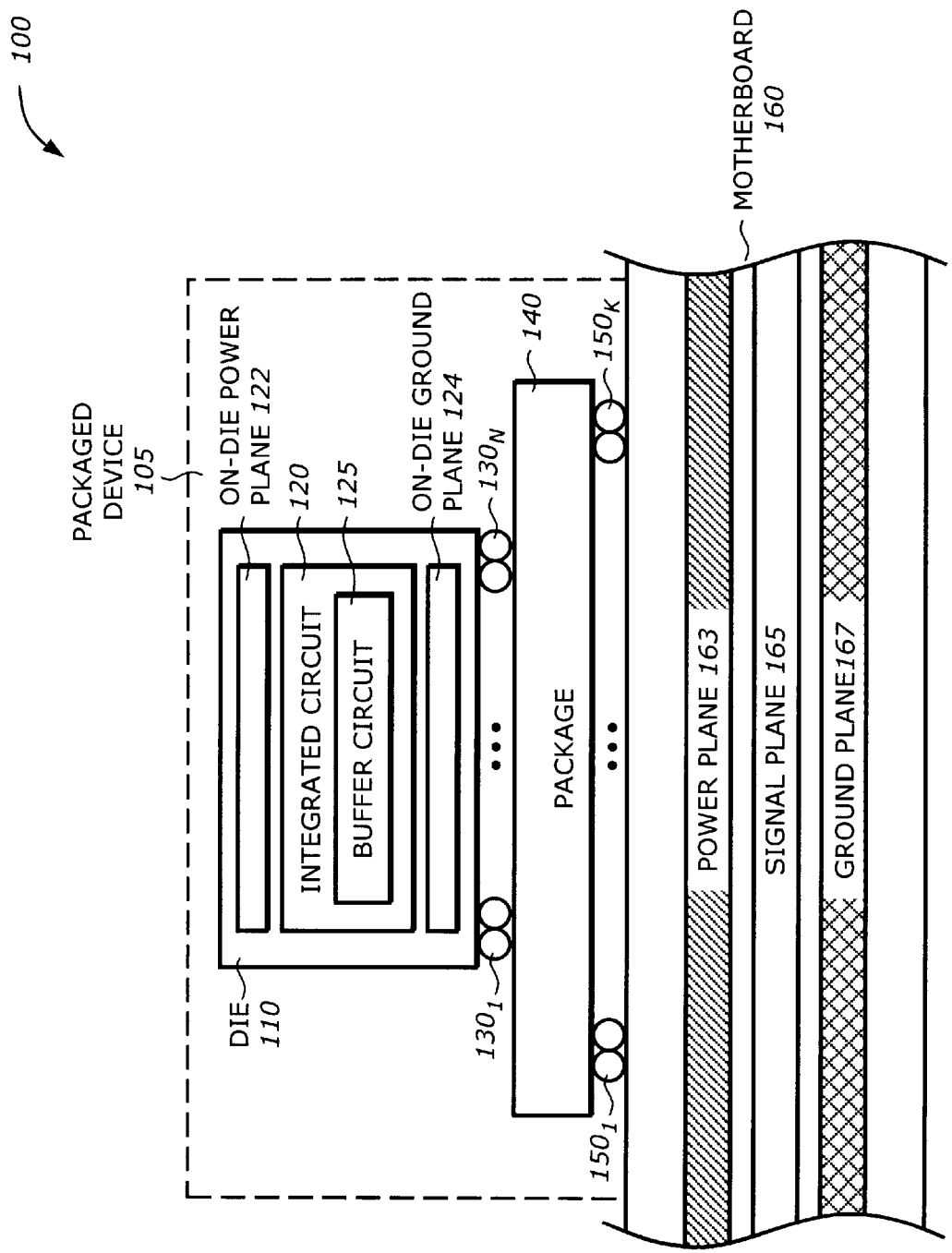
FIG. 1 is a diagram illustrating a system in which one embodiment of the invention can be practiced.

FIG. 1 is a diagram illustrating a system 100 in which one embodiment of the invention can be practiced. The system 100 includes a packaged device 105 and a motherboard 160.

The packaged device 105 includes a die 110, N connecting elements $130_1$ to $130_N$, a package 140, K connecting elements $150_1$ to $150_K$, and a motherboard 160.

The die 110 includes an integrated circuit 120 and an on-die power plane 122, and an on-die ground plane 124. The integrated circuit 120 is any circuit that operates at high frequency such as a microprocessor, a micro-controller, a memory device, a digital signal processor, a graphics processor, an interfacing device, a network device, an input/output controller hub, a memory controller hub, a peripheral device, etc. The integrated circuit 120 includes a buffer circuit 125. The buffer circuit 125 provides input and output interfaces between the core of the integrated circuit 120 and external circuitry. The on-die power plane 122 distributes the power supplies to various power connections on the integrated circuit 120. The on-die ground plane 124 provides grounding to various ground connections on the integrated circuit 120.

The $130_1$ to $130_N$ provide interconnections between the integrated circuit 120 and the package 140. The $130_1$ to $130_N$ may be solder bumps or any other interconnecting structure. The package 140 provides packaging structure for the die 110. The package structure may use any packaging technology such as Plastic Quad Flatpack (PQFP), Thin Quad Flatpack (TQFP), Thin Small Outline Package (TSOP), Thin Shrink Small Outline Package (TSSOP), Small Outline Integrated Circuit (SOIC), Shrunk Small Outline Package (SSOP), Plastic Leadless Chip Carrier (PLCC), Pin Grid Array (PGA), and Ball Grid Array (BGA).

The K connecting elements $150_1$ to $150_K$ provide interconnections between the package 140 and the motherboard 160. The K connecting elements $150_1$ to $150_K$ may be any interconnecting elements depending on the packaging structure. For example, for BGA packaging, the K connecting elements $150_1$ to $150_K$ may be solder balls.

The motherboard 160 is a board that contains a number of devices including the packaged device 105. The motherboard is typically a printed circuit board (PCB) that has many internal layers formed into planes. The motherboard 160 includes a large or small island of board power plane 163, a board signal plane 165, and a large or small island of board ground plane 167. One skilled in the art may readily recognize that the arrangement of these planes or layers is a design choice and may be in any order. The board power and ground planes 163 and 167 distribute the power and ground supplies to various packaged devices populated on the motherboard 160. The signal plane 165 contains the signal traces that connect the pins or pads of the packaged devices on the motherboard 160. The number, size, and position of these planes depend on the board layout requirements.

Figure 2:
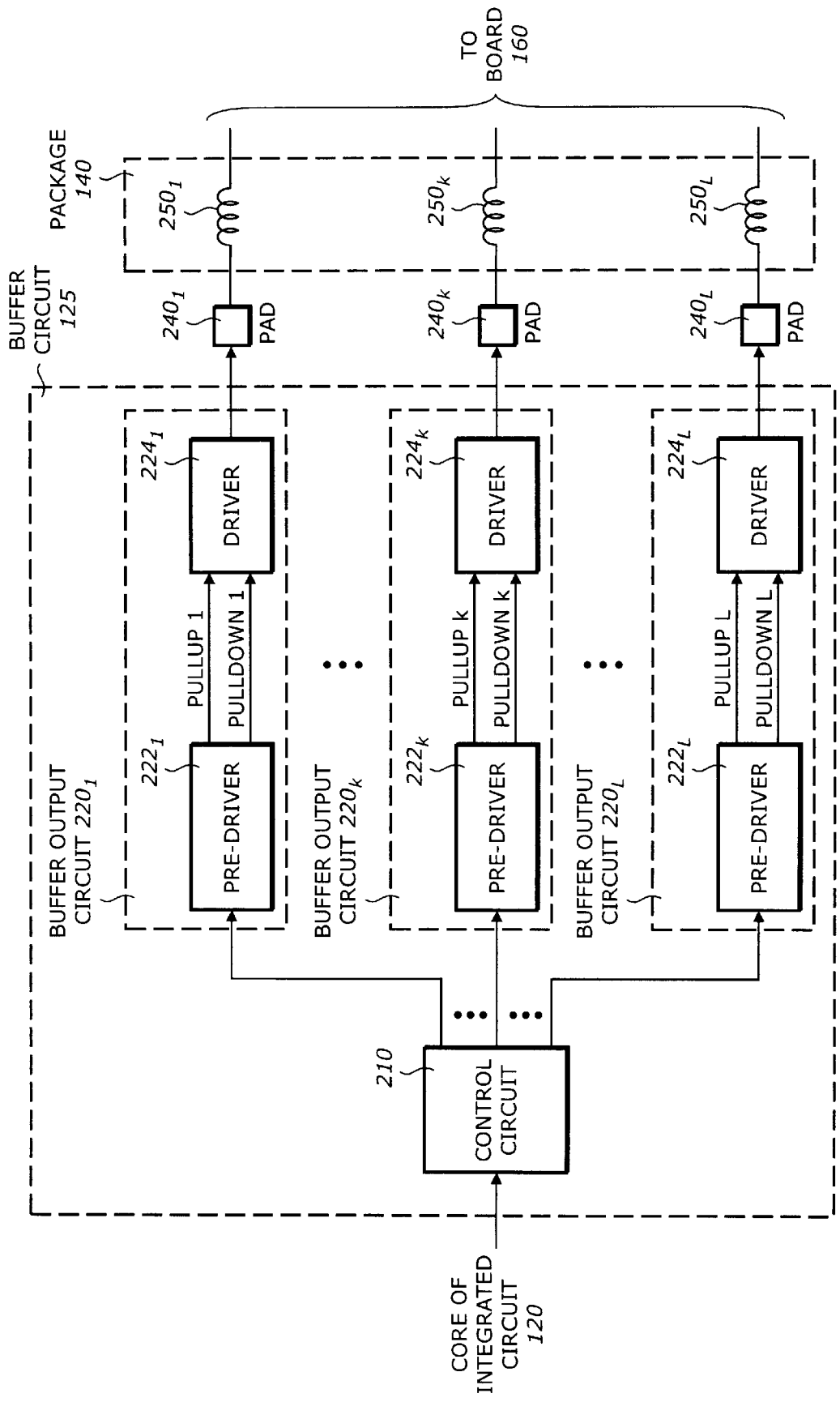
FIG. 2 is a diagram illustrating a buffer circuit shown in FIG. 1 according to one embodiment of the invention.

FIG. 2 is a diagram illustrating a buffer circuit 125 shown in FIG. 1 according to one embodiment of the invention. The buffer circuit 125 provides output connections to L pads $240_1$ to $240_L$. The L pads $240_1$ to $240_L$ are in turn connected through the package parasitic elements $250_1$ to $250_L$ to the mother board. The buffer circuit 125 includes a control circuit 210 and M buffer output circuits $220_1$ to $220_M$.

The control circuit 210 generates control signals to the buffer output circuits from the core of the integrated circuit. The control signals may include impedance control bits to match impedance of the buffer output circuits $220_1$ to $220_M$ with the load. The buffer output circuits $220_1$ to $220_M$ generate output signals to the external world. Typically, these output signals have high switching frequency. The output signals should have enough drive strength to drive the load capacitance and acceptable slew rate. Each of the output buffer circuits 220₁ to 220_M includes a pre-driver 222 and a driver 224. For clarity, the subscripts are dropped in the following description.

The drive strength requirements are met by having programmable impedance controlled drivers 224. By turning on or off some of the legs of the drivers, the drive strength can be controlled to meet the impedance requirements across process, voltage, and temperature (PVT) variations. The main function of the pre-driver 222 is to control the edge rate, or slew rate, across PVT variations.

Figure 3:
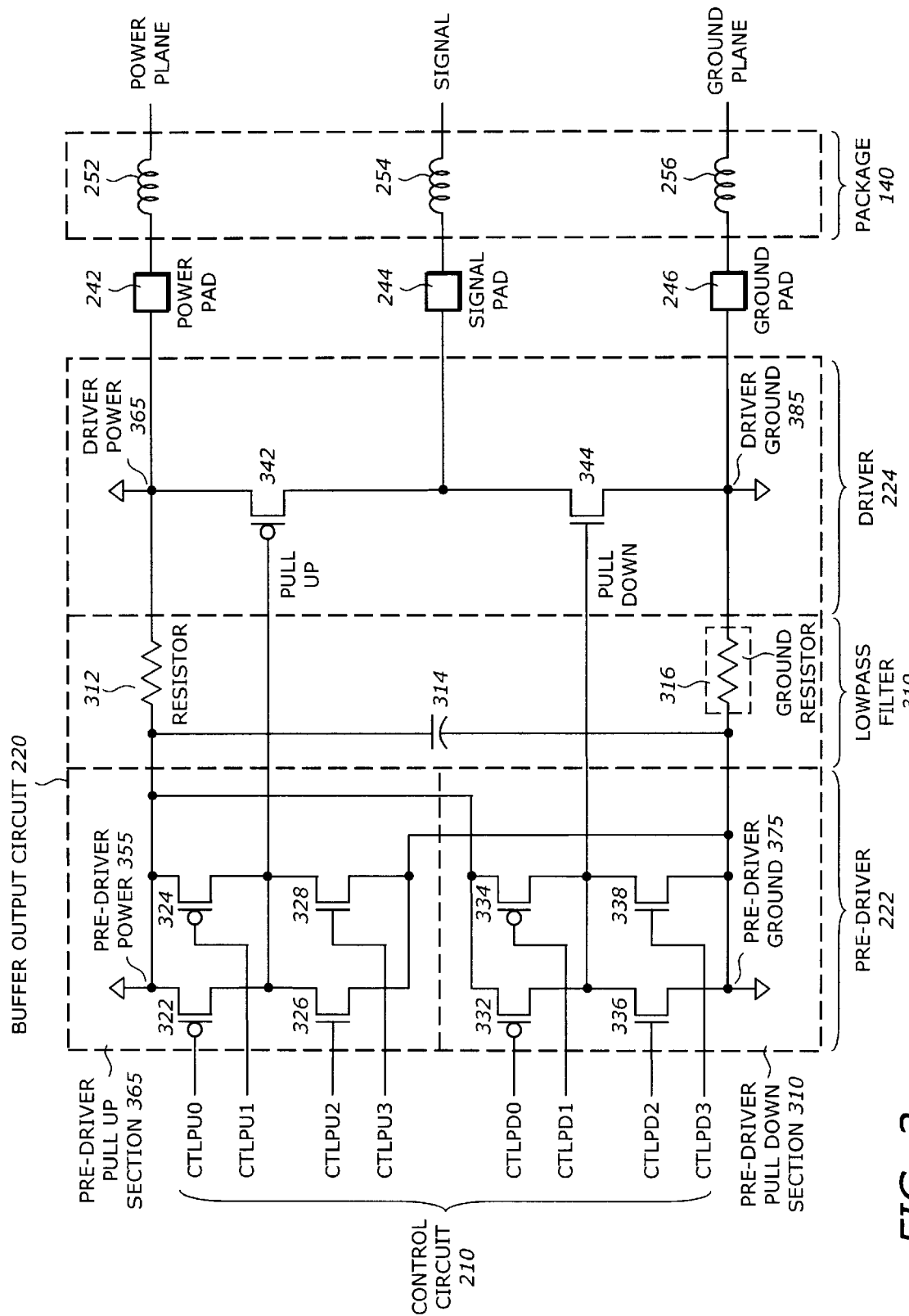
FIG. 3 is a diagram illustrating a pre-driver and a driver shown in FIG. 2 according to one embodiment of the invention.

FIG. 3 is a diagram illustrating a buffer output circuit 220 shown in FIG. 2 according to one embodiment of the invention. The buffer output circuit 220 includes a pre-driver 222, a low-pass filter 310, and a driver 224.

The pre-driver 222 includes a pre-driver pull-up section 320 and a pre-driver pull-down section 330. The pre-driver pull-up section 320 includes n-transistors 322 and 324 and p-transistor 326 and 328. The gates of these transistors are controlled by the control signals CTLPU[0:X−1], where X is the number of pull up control signals, from the control circuit 210. By asserting various logic levels on the CTLPU [0:X−1], the transistors 322, 324, 326, and 328 are turned on and off accordingly to provide proper current drive to the driver 224. Similarly, the pre-driver pull-down section 330 includes n-transistors 332 and 334 and p-transistor 336 and 338. The gates of these transistors are controlled by the control signals CTLPD[0:Y−1], where Y is the number of pull down control signals, from the control circuit 210. By asserting various logic levels on the CTLPD[0:Y−1], the transistors 332, 334, 336, and 338 are turned on and off accordingly to provide proper current drive to the driver 224. As is known by one skilled in the art, any number of p-transistors and n-transistors may be used in each of the pull-up or pull-down sections depending on drive requirements. The pre-driver has a pre-driver power connection 355 and a pre-driver ground connection 375. The pre-driver 222 generate pre-driving signals pull-up and pull-down to the driver 224. The pre-driving signals are switched between HIGH and LOW to drive the logic level of the output signal to HIGH or LOW. The switching frequency of the pre-driving signals are within a frequency band.

The driver 224 generates an output signal to the signal pad 244 which is connected to an inductor 254 in the package 140. The driver 224 includes a pull-up n-transistor 342 and a pull-down p-transistor 344. The gates of these transistors are controlled by the pull-up and pull-down signals generated from the pre-driver 222. The driver 224 has a driver power connection 365 and a driver ground connection 385. The driver power and ground connections 365 and 385 are connected to power and ground pads 242 and 246 which are in turn connected to package parasitic elements 252 and 256, respectively. The driver 224 and the pre-driver 222 have a switching frequency within a frequency band.

The pre-driver power connection 355 and the driver power connection 365 are typically connected to the highest voltage, referred to as PWRP, at the interface which is determined based on the signal swings of the data transfer protocol. During signal switching, the driver 224 draws large currents to meet the electrical requirements (e.g., drive strength). The undesirable surge caused by the transient current requirement for the driver 224 is partly filtered by the on-die de-coupling capacitor and proportionately by other capacitors closer to the die in the package 140 and the motherboard 160 in that order.

The low-pass filter 310 acts to reduce the undesirable noise cause by signal switching. It renders the slew rate less susceptible to the supply noise. The effect of signal switching may be better understood when a circuit analysis is performed without the low-pass filter 310 as follows. When the driver 224 transmits the output signal at a logic HIGH level to the signal pad 244, the pull-up transistor 342 is turned on and charge the load capacitance through the pull-up path. This causes the driver 224 to source high current through the package 140. This transient current will cause a transient voltage drop L*di/dt across the package inductor 344 causing the PWRP voltage level to drop momentarily. This is the power bounce scenario. The noise associated with this event may be very high because many buffers may switch in the same direction. Similarly, noise may be generated when the buffers switch from HIGH to LOW. In this case, the pull-up legs are turned off and the pull-down legs are turned on. These turn-on and turn-off transients cause significant noise in the power and ground rails on the die.

Without the low-pass filter 310, the pre-driver 222 and the driver 224 share the same on-die power and ground supplies. This fact may worsen the noise situation. Consider a switching event from HIGH to LOW for the output buffer. This transition turns off the pull-up transistor 342 and turns on the pull-down transistor 344. This will cause a momentary surge in the PWRP voltage. As the PWRP surge occurs, the pre-driver 222 will increase the rate at which the pull-up transistor is turned off and the pull-down transistor is turned on. This will cause an even higher surge in the PWRP voltage. There is a positive feedback loop that goes on until either the driver transistors are completely turned on or off. The effect of this feedback loop is to cause high noise on the PWRP rail and large slew rate mismatches at the pads. For a buffer designed for an edge rate of 1–3V/ns under nominal voltages, this power supply noise may be as high as 200 mV, which may result in an edge rate of 8–10V/ns. The problem is even more compounded if there is a resonance at the power supply. These effects can introduce rising Vs falling edge mismatches and can cause significant impact on signal quality and timing.

The low-pass filter 310 therefore helps reducing the noise caused by these transient events. The low pass filter 310 is coupled between the pre-driver 222 and the driver 224 to reduce noise at the pre-driver power supply. The low-pass filter 310 has a cut-off frequency that depends on the frequency of noise. The low-pass filter 310 includes a resistor 312 and a capacitor 314. The resistor 312 is connected between the pre-driver power connection 355 and the driver power connection 365. The resistor 312 has a resistance selected according to a pre-determined voltage drop and a current limit of the pre-driver 222. For example, if the current limit is 5 mA and the maximum voltage drop is 50 mV, then the resistance is 10 Ohms. The capacitor 314 is connected between the pre-driver power connection 355 and the pre-driver ground connection 375. The capacitor 314 has a capacitance selected according to the selected resistance and the cut-off frequency.

In addition to the low-pass filter 310, the ground supply for the pre-driver 222 may also be isolated from that for the driver 224. This can be achieved by connecting a ground resistor 316 between the pre-driver ground connection 375 and the driver ground connection 385. The resistance of the ground resistor 316 is also selected according to a pre-defined voltage drop and a current limit. Typical values may be in the range of a few Ohms to approximately 10 Ohms.

Figure 4:
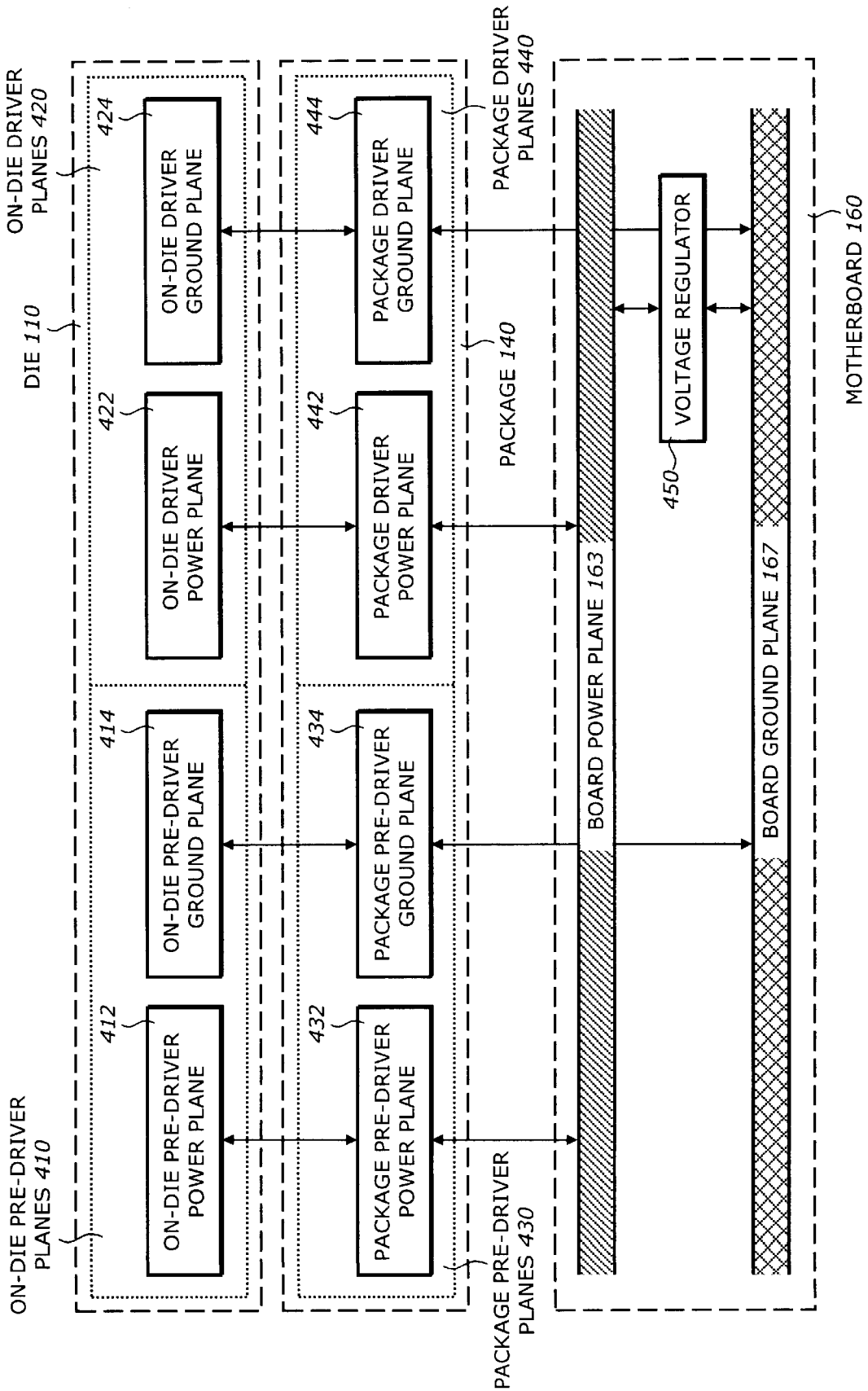
FIG. 4 is a diagram illustrating a separation of power and ground planes according to one embodiment of the invention.

FIG. 4 is a diagram illustrating a separation of power and ground planes according to one embodiment of the invention.

By isolating the pre-driver power plane from the driver power plane and the pre-driver ground plane from the driver ground plane, the effects caused by one part will not propagate much to the other part. The isolation or separation of the pre-driver and driver power and ground planes not only occurs in the die of the integrated circuit but also in the package. The die 110 includes on-die pre-driver power and ground planes 410 and on-die driver power and ground planes 420. The two sets of planes are completely separated in the die 110 of the integrated circuit 120. This separation helps maintain the slew rate at the desired rate. The on-die pre-driver planes 410 include an on-die pre-driver power plane 412 and on-die pre-driver ground plane 414. All the pre-driver power connections are connected to the on-die pre-driver power plane 412. All the pre-driver ground connections are connected to the on-die pre-driver ground plane 414. The on-die driver planes 420 include an on-die driver power plane 422 and on-die driver ground plane 424. All the driver power connections are connected to the on-die driver power plane 422. All the driver ground connections are connected to the on-die driver ground plane 424.

The package 140 includes package pre-driver power and ground planes 430 and package driver power and ground planes 440. Again, the two sets of planes are completely separated in the package 140. The package pre-driver planes 430 include a package pre-driver power plane 432 and package pre-driver ground plane 434. The package driver planes 440 include a package driver power plane 442 and a package driver ground plane 444.

The motherboard 160 includes a board power plane 163 and a board ground plane 167 as shown in FIG. 1. A voltage regulator 450 is coupled between the board power plane 163 and the board ground plane 167. The on-die pre-driver power plane 412 is connected to the package pre-driver power plane 432 which is connected to the board power plane 163. The on-die pre-driver ground plane 414 is connected to the package pre-driver ground plane 434 which is connected to the board ground plane 167. Similarly, the on-die driver power plane 422 is connected to the package driver power plane 442 which is connected to the board power plane 163. The on-die driver ground plane 424 is connected to the package driver ground plane 444 which is connected to the board ground plane 167. Since the pre-driver planes are well separated from the driver planes in both the die 110 and the package 140, the noise due to signal switching can be much reduced and the slew rate is improved.

This invention provides a mechanism to maintain a stable slew rate in presense of noise. The invention reduces the noise on the driver power supply that may arise due to di/dt variations. A stable slew rate reduces slew rate dependent noise on the driver power supply and therefore provides a robust power supply delivery.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a pre-driver coupled to a control circuit to generate pre-driving signals based on control signals provided by the control circuit, the pre-driver having pre-driver power and ground connections;
   a driver coupled to the pre-driver to generate an output signal based on the pre-driving signals at an output pad, the output signal having a slew rate, the driver having driver power and ground connections; and
   a low pass filter coupled between the pre-driver power connection and the driver power connection and between the pre-driver ground connection and the driver ground connections connection to reduce noise at the pre-driver, the low pass filter having a cut-off frequency corresponding to noise frequency.

2. The apparatus of claim 1 wherein the low pass filter maintains the slew rate.

3. The apparatus of claim 1 wherein the low pass filter comprises:
   a resistor connected between the pre-driver and driver power connections, the resistor having a resistance selected according to a pre-determined voltage drop and a current limit of the pre-driver; and
   a capacitor connected between the pre-driver power and ground connections, the capacitor having a capacitance selected according to the selected resistance and the cut-off frequency.

4. The apparatus of claim 1 further comprising:
   a ground resistor coupled between the pre-driver ground and the driver ground to isolate the pre-driver ground from the driver ground.

5. The apparatus of claim 4 wherein the ground resistor has a resistance selected according to a pre-determined voltage drop and a ground current limit.

6. A method comprising:
   generating pre-driving signals using a pre-driver based on control signals provided by a control circuit, the pre-driver having pre-driver power and ground connections;
   generating an output signal using a driver based on the pre-driving signals at an output pad, the output signal having a slew rate, the driver having driver power and ground connections; and
   reducing noise at the pre-driving signals using a low pass filter placed between the pre-driver power connection and the driver power connection and between the pre-driver ground connection and the driver ground connection, the low pass filter having a cut-off frequency corresponding to noise frequency.

7. The method of claim 6 wherein reducing the noise comprises maintaining the slew rate.

8. The method of claim 6 wherein reducing the noise comprises:
   providing a resistor connected between the pre-driver and driver power connections, the resistor having a resistance selected according to a pre-determined voltage drop and a current limit of the pre-driver; and
   providing a capacitor connected between the pre-driver power and ground connections, the capacitor having a capacitance selected according to the selected resistance and the cut-off frequency.

9. The method of claim 6 further comprising:
   isolating the pre-driver ground from the driver ground using a ground resistor.

10. The method of claim 9 wherein the ground resistor has a resistance selected according to a pre-determined voltage drop and a ground current limit.

11. A device comprising:
    a package having package power and ground planes and output pins to interface to a board having board power and ground planes;

an integrated circuit on a die coupled to the package, the integrated circuit having a buffer circuit, the buffer circuit comprising:

a pre-driver coupled to a control circuit to generate pre-driving signals based on control signals provided by the control circuit, the pre-driver having pre-driver power and ground connections, a driver coupled to the pre-driver to generate an output signal based on the pre-driving signals at an output pad, the output signal having a slew rate, the driver having driver power and ground connections, and a low pass filter coupled between the pre-driver power connection and the driver power connection and between the pre-driver ground connection and the driver ground connection to reduce noise at the pre-driving signals, the low pass filter having a cut-off frequency corresponding to noise frequency.

12. The device of claim 11 wherein the low pass filter maintains the slew rate.

13. The device of claim 11 wherein the low pass filter comprises:

a resistor connected between the pre-driver and driver power connections, the resistor having a resistance selected according to a pre-determined voltage drop and a current limit of the pre-driver; and a capacitor connected between the pre-driver power and ground connections, the capacitor having a capacitance selected according to the selected resistance and the cut-off frequency.

14. The device of claim 11 further comprising:

a ground resistor coupled between the pre-driver ground and the driver ground to isolate the pre-driver ground from the driver ground.

15. The device of claim 14 wherein the ground resistor has a resistance selected according to a pre-determined voltage drop and a ground current limit.

* * * * *

UNITED STATES PATENT AND TRADEMARK OFFICE
CERTIFICATE OF CORRECTION

PATENT NO.  : 6,617,891 B2
DATED       : September 9, 2003
INVENTOR(S) : Srikanth et al.

It is certified that error appears in the above-identified patent and that said Letters Patent is hereby corrected as shown below:

<u>Column 6,</u>
Line 8, before "connection", delete "connections".

Signed and Sealed this

Second Day of December, 2003

JAMES E. ROGAN
*Director of the United States Patent and Trademark Office*